(12) United States Patent
Huang et al.

(10) Patent No.: US 8,670,233 B2
(45) Date of Patent: Mar. 11, 2014

(54) HANDLE MODULE AND ELECTRONIC DEVICE HAVING THE HANDLE MODULE

(75) Inventors: Min-Hsiung Huang, Hsichih District (TW); Ming-Jen Tsai, Hsichih Dist. (TW); Jung-Shu Hsiao, Hsichih Dist. (TW)

(73) Assignee: Wistron Corporation, New Taipei (TW)

( * ) Notice: Subject to any disclaimer, the term of this patent is extended or adjusted under 35 U.S.C. 154(b) by 349 days.

(21) Appl. No.: 13/113,781

(22) Filed: May 23, 2011

(65) Prior Publication Data

US 2011/0317345 A1 Dec. 29, 2011

(30) Foreign Application Priority Data

Jun. 24, 2010 (TW) ................................ 99120615 A (51) Int. Cl.
*B25G 1/04* (2006.01)
*G06F 1/16* (2006.01)
*H05K 5/00* (2006.01)
*H05K 7/00* (2006.01)

(52) U.S. Cl.
USPC ........................................ 361/679.59; 16/429

(58) Field of Classification Search
USPC ............. 361/679.01, 679.02, 679.21, 679.22, 361/679.59; 16/110.1, 113.1, 405, 409, 16/429, 444, 445
See application file for complete search history.

(56) References Cited

U.S. PATENT DOCUMENTS

| | | | | |
|---|---|---|---|---|
| 4,373,918 A * | 2/1983 | Berman | .................... | 434/307 R |
| 4,895,231 A * | 1/1990 | Yamaguchi et al. | .......... | 190/115 |
| 5,075,926 A * | 12/1991 | Jeong | .............. | 16/429 |
| 5,105,335 A * | 4/1992 | Honda | .................... | 361/679.01 |
| 5,157,585 A * | 10/1992 | Myers | .................... | 361/679.17 |
| 5,247,285 A * | 9/1993 | Yokota et al. | ............ | 361/679.17 |
| 5,825,614 A * | 10/1998 | Kim | ........................ | 361/679.55 |
| 6,017,106 A * | 1/2000 | Adams et al. | ............... | 312/223.2 |
| 6,654,235 B2 * | 11/2003 | Imsand | .................... | 361/679.09 |
| 7,035,093 B2 * | 4/2006 | Imsand | .................... | 361/679.55 |
| 7,054,152 B2 * | 5/2006 | Francke et al. | .......... | 361/679.33 |
| 7,342,778 B2 * | 3/2008 | Fan et al. | ................. | 361/679.55 |
| 7,574,771 B2 * | 8/2009 | Cheng | ......................... | 16/114.1 |
| 7,936,562 B2 * | 5/2011 | Nagamura et al. | ........ | 361/679.59 |
| 2006/0067040 A1 * | 3/2006 | Imsand | .................... | 361/683 |
| 2007/0076362 A1 * | 4/2007 | Lagnado | ...................... | 361/683 |
| 2010/0020490 A1 * | 1/2010 | Lin | ......................... | 361/679.55 |
| 2010/0053888 A1 * | 3/2010 | Nagamura et al. | ........ | 361/679.59 |
| 2010/0301717 A1 * | 12/2010 | Wang | .......................... | 312/223.1 |

* cited by examiner

*Primary Examiner* — Adrian S Wilson
(74) *Attorney, Agent, or Firm* — Merchant & Gould P.C.

(57) ABSTRACT

A handle module mounted in a case of an electronic device and including a handle-link assembly and a slide mechanism. The handle-link assembly includes a handle body having a gripping section and a first pivot connection portion formed thereon, and a slide link having a link body unit and a second pivot connection portion formed thereon. The second pivot connection portion is pivotable with the first pivot connection portion. The slide mechanism includes a slide groove unit disposed in the link body unit or the case, and a slide axle unit disposed slidably in the link body unit or the case, and that is slidably extended into the slide groove unit. The handle-link assembly may be moved between a folded state, where the slide link is received in the case, and an unfolded state, where the slide link is extended out of the case.

22 Claims, 10 Drawing Sheets

HANDLE MODULE AND ELECTRONIC DEVICE HAVING THE HANDLE MODULE

CROSS REFERENCE TO RELATED APPLICATION

This application claims priority of Taiwanese Application No. 099120615 filed on Jun. 24, 2010, the disclosure of which is hereby incorporated by reference.

BACKGROUND OF THE INVENTION

1. Field of the Invention

The present invention relates to an electronic device and a handle module thereof, and more particularly, to an electronic device and a handle module mounted in a case of the electronic device so that the handle module can be stowed away when the electronic device is not in use.

2. Description of the Related Art

Typical computer electronic devices, such as all-in-one computers, notebook computers, servers, etc., have the general shape of a monitor screen or box. When desiring to move or carry such an electronic device, the entire electronic device must be moved or carried. This is not only strenuous, but since both hands typically must be used, it is inconvenient to move or carry the electronic device.

SUMMARY OF THE INVENTION

Therefore, an object of the present invention is to provide a handle module that is mounted on a case of an electronic device to provide for user convenience in moving or carrying the electronic device.

Another object of the present invention is to provide an electronic device having the above-described handle module.

According to one aspect of this invention, the handle module for mounting in a case of an electronic device comprises:

a handle-link assembly including a handle body having a gripping section exposed from the case, and a first pivot connection portion formed on the gripping section, and a slide link having a link body unit, and a second pivot connection portion formed on the link body unit, the second pivot connection portion of the slide link being pivotable with the first pivot connection portion of the handle body; and a slide mechanism including a slide groove unit disposed in one of the link body unit and the case of the electronic device, and a slide axle unit disposed slidably in the other one of the link body unit and the case of the electronic device, and that is slidably extended into the slide groove unit;

the handle-link assembly being operable to be moved between a folded state, where the slide link is received in the case, and an unfolded state, where the slide groove unit and the slide axle unit are moved relative to each other until the slide link is extended out of the case and the handle body is distanced more from the case than when in the folded state.

According to another aspect of this invention, the electronic device comprises:

a case including a side wall, and formed with an opening portion extending through the side wall;

an electronic component module mounted in the case; and a handle module including a handle-link assembly including a handle body having a gripping section exposed from the case, and a first pivot connection portion formed on the gripping section, and a slide link having a link body unit, and a second pivot connection portion formed on the link body unit, the second pivot connection portion of the slide link being pivotable with the first pivot connection portion of the handle body, and a slide mechanism including a slide groove unit disposed in one of the link body unit and the case, and a slide axle unit disposed slidably in the other one of the link body unit and the case, and that is slidably extended into the slide groove unit;

the handle-link assembly being operable to be moved between a folded state, where the slide link is received in the case, and an unfolded state, where the slide groove unit and the slide axle unit are moved relative to each other, and the slide link is extended out of the case through the opening portion and the handle body is distanced more from the side wall of the case than when in the folded state.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EMBODIMENTS

Before the present invention is described in greater detail with reference to the accompanying embodiments, it should be noted herein that like elements are denoted by the same reference numerals throughout the disclosure.

Figure 1:
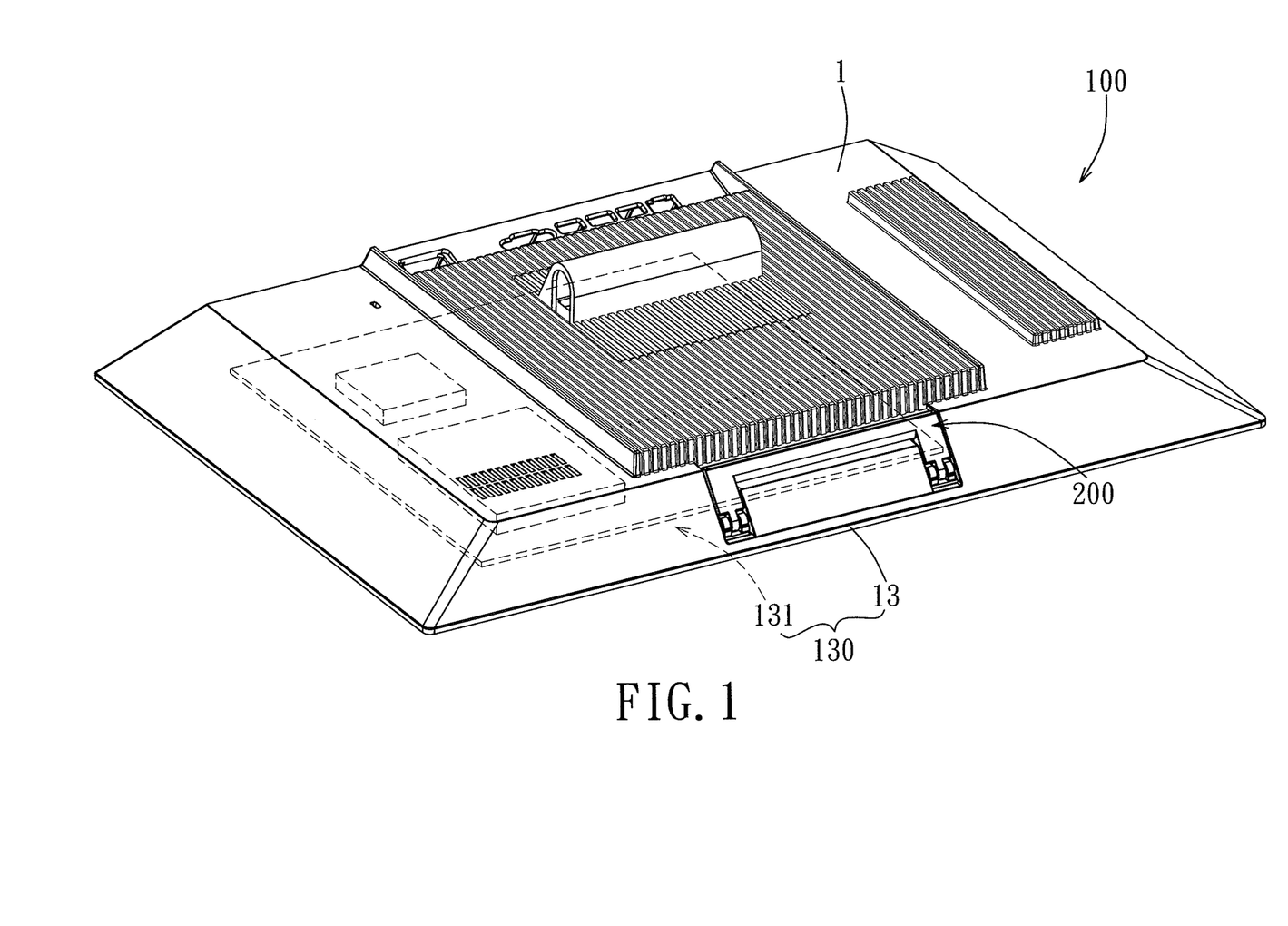
FIG. 1 is a perspective view of the first embodiment of an electronic device having a handle module according to the present invention, in which a handle-link assembly of the handle module is in a folded state.
Figure 2:
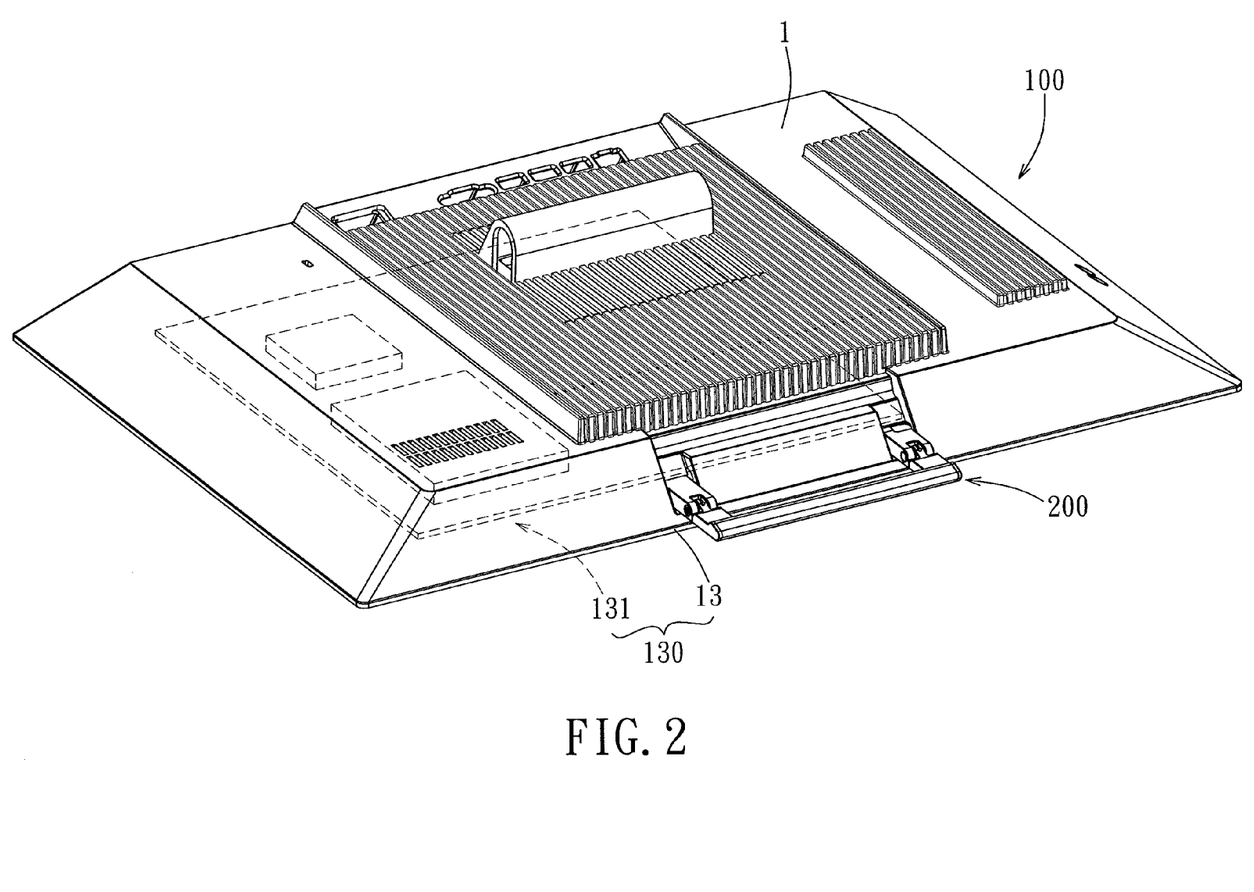
FIG. 2 is a perspective view of the first embodiment, in which the handle-link assembly is in an unfolded state.
Figure 3:
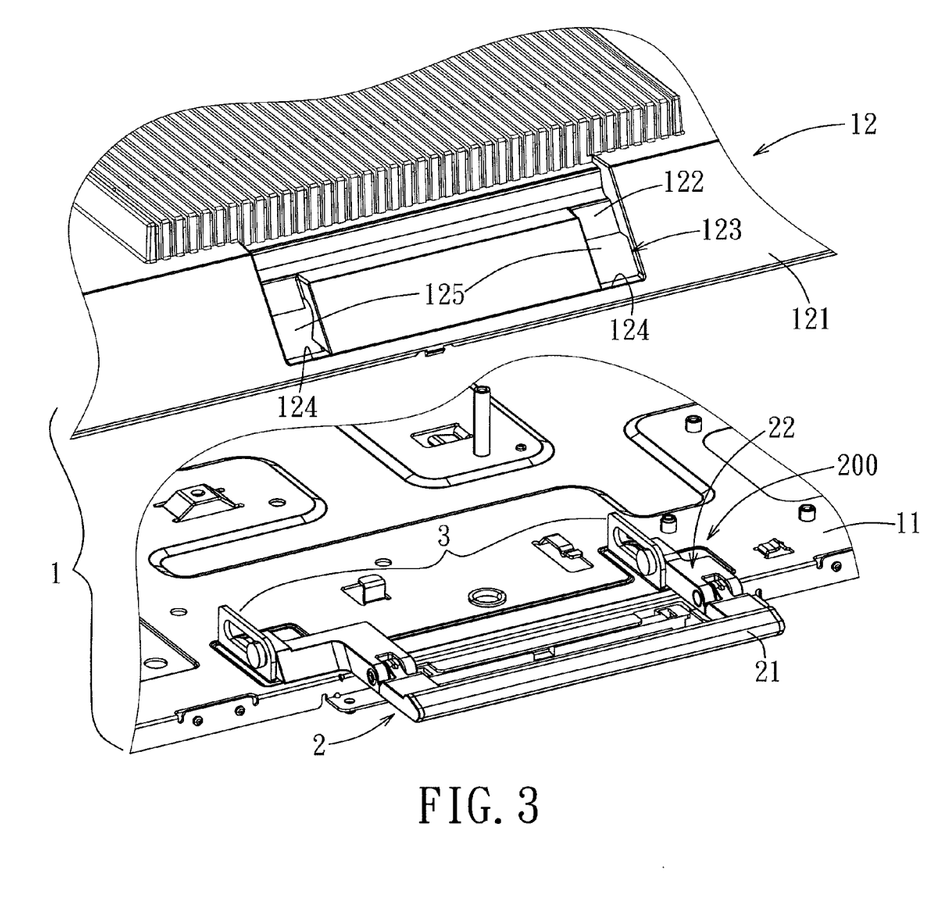
FIG. 3 is an exploded perspective view for illustrating an outer shell of a case of the first embodiment of the electronic device in a state detached from a substrate.

Referring to FIGS. 1 to 3, the first embodiment of an electronic device 100 having a handle module according to the present invention comprises a case 1, an electronic component module 130 mounted in the case 1, and a handle module 200. In this embodiment, the electronic device 100 is an all-in-one computer, but the present invention is not limited in this regard and the electronic device 100 may be a notebook computer, a server and the like.

The case 1 includes a substrate 11, and an outer shell connected to the substrate 11. The electrical component module 130 is connected to the case 1, and includes a display module 13 and a host component 131. The display module 13 is a touch control panel, and the host component 131 includes a motherboard, a central processing unit, a scratchpad memory, a hard disk drive, and other electronic components mounted on or to the motherboard for successful operation of the computer host. The host component 131 is generally disposed in the case 1.

In this embodiment, the outer shell 12 is the back shell of the electronic device 100, and the front of the electronic device 100 is formed by the display module 13. The substrate 11 and the host component 131 are encapsulated between the outer shell 12 and the display module 13. The outer shell 12 has a side wall 121, and is formed with a receiving groove 122 on an outer surface of the side wall 121 and an opening portion 123 extending through the side wall 121. The side wall 121 may be disposed at the top of the outer shell 12, and the receiving groove 122 is generally U-shape having a pair of end portions 124 that extend in the same direction. The opening portion 123 includes a pair of orifices 125, each disposed at one of the end portions 124 of the receiving groove 122 and extending through the side wall 121.

Figure 4:
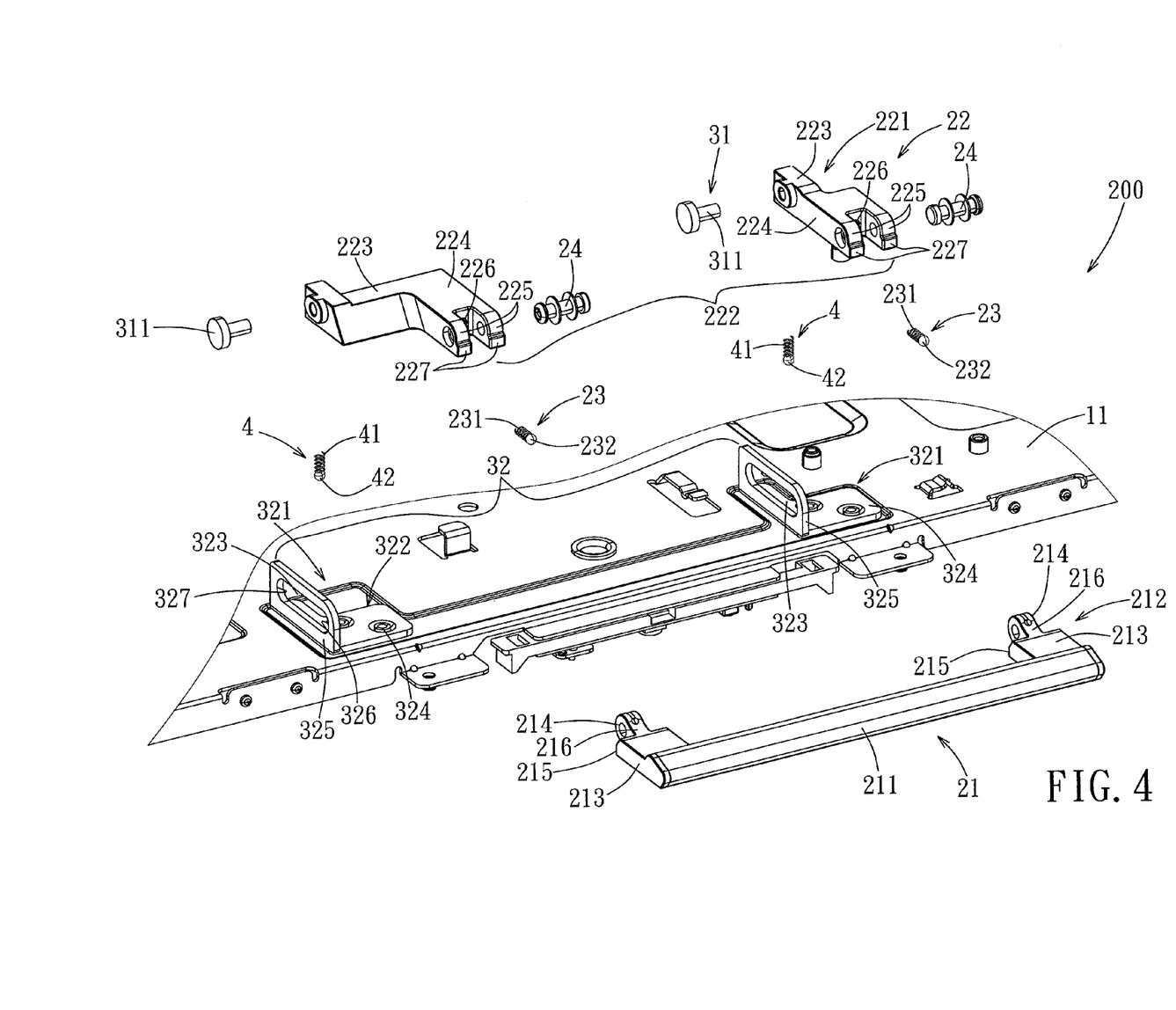
FIG. 4 is an exploded perspective view of a handle module of the first embodiment.
Figure 5:
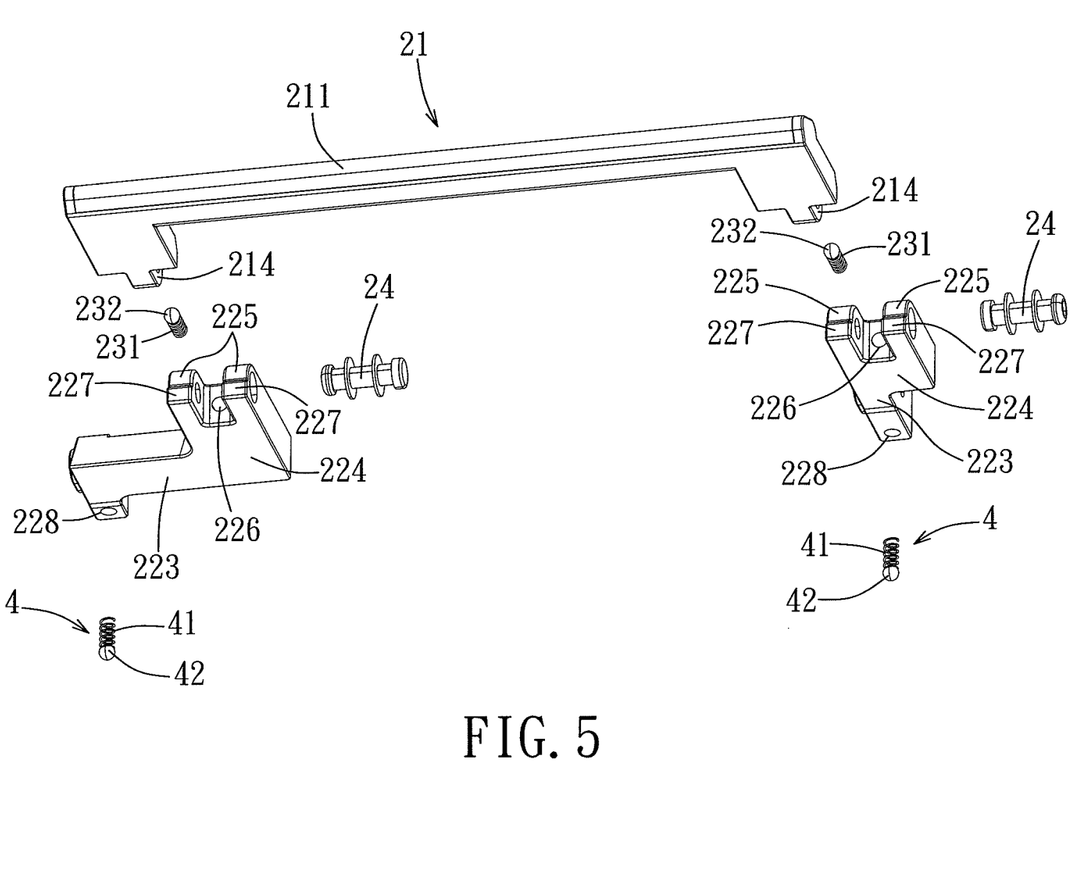
FIG. 5 is an exploded perspective view of a handle-link assembly of the handle module of the first embodiment.

Referring to FIGS. 3 to 5, the handle module 200 includes a handle-link assembly 2 and a slide mechanism 3. The handle-link assembly 2, in turn, includes a handle body 21, a slide link 22, a pair of first biasing units 23, and a pair of pivot axles 24. The handle body 21 is connected pivotably to the slide link 22 through the pivot axles 24, and is exposed from the case 1 (as shown in FIG. 1). The slide link 22 is mounted to the case 1 through the slide mechanism 3 and is slidable relative to the case 1 such that the handle-link assembly 2 may be manipulated to move between a folded state as shown in FIG. 1 and an unfolded state as shown in FIG. 2.

In greater detail, the handle body 21 includes a gripping section 211 and a first pivot connection portion 212 connected to the gripping section 211. The gripping section 211 is formed as an elongate rod. The first pivot connection portion 212 includes a pair of first extension sections 213 extending in the same direction from opposite ends of the gripping section 211, and a pair of first protruding pieces 214 extending respectively from ends of the first extension sections 213. A first abutting surface 215 is formed on each side of the first protruding piece 214 on an end face of each of the first extension sections 213. The gripping section 211 and the two first extension sections 213 cooperate to form a U-shape. Each of the first protruding pieces 214 is ring-shaped and has an outer circumferential surface 216, and with further reference to FIG. 6, a first positioning groove 217 and a second positioning groove 218 are formed inwardly in the outer circumferential surface 216 of the first protruding piece 214 and along the circumferential direction thereof.

The slide link 22 includes a link body unit 221, and a second pivot connection portion 222 formed on the link body unit 221. In this embodiment, the link body unit 221 includes a pair of sliding blocks 223. The second pivot connection portion 222 includes a pair of second extension sections 224 which extend in the same direction respectively from the sliding blocks 223, and two pairs of spaced apart second protruding pieces 225, each pair extending in the same direction from one of the second extension sections 224. The handle body 21 extends toward the second extension sections 224 via the first extension sections 213 thereof, and the first protruding piece 214 of each of the first extension sections 213 extends between the second protruding pieces 225 of the corresponding second extension section 224, and a pivotable connection between the handle body 21 and the slide link 22 is realized by the pivot axles 24 extending into the first protruding pieces 214 and the second protruding pieces 225. Moreover, a first receiving cavity 226 is formed extending inwardly on an end portion of each of the second extension sections 224 at a location between the corresponding second protruding pieces 225, and each of the second protruding pieces 225 has a second abutting surface 227 facing the circumferential surface of the corresponding first extension section 213.

Referring to FIGS. 3 to 6, each of the first biasing units 23 includes a spring 231 and an engaging element 232. In this embodiment, the engaging element 232 is a ball, and the spring 231 of each of the first biasing units 23 is retained in the first receiving cavity 226 of the corresponding second extension section 224 so that the engaging element 232 abuts against the other end of the spring 231 and protrudes resiliently out of the first receiving cavity 226. The operation of the first biasing units 23 will be described hereinafter.

The slide mechanism 3 includes a slide axle unit 31 and a slide groove unit 32. In this embodiment, the slide groove unit 32 includes a pair of slide groove seats 321 disposed spaced apart from each other and fixed to the substrate 11. Each of the slide groove seats 321 is disposed at a position corresponding to one of the orifices 125 of the opening portion 123 of the case 1 (see FIG. 3). Each of the slide groove seats 321 includes a seat body 322 formed with a sliding groove 323. The seat body 322 is generally L-shaped, and includes a bottom plate portion 324 extending horizontally, and an upright plate portion 325 extending upwardly from the bottom plate portion 324. The sliding groove 323 is formed in the upright plate portion 325, and has opposite first and second ends 326, 327. The two seat bodies 322 are fixed to the substrate 11 respectively through the bottom plate portions 324 thereof, such that the sliding grooves 323 are spaced apart in a left-to-right direction. The first ends 326 of the sliding grooves 323 are adjacent to the side wall 121 of the case 1, and the second ends 327 thereof are distanced from the side wall 121 of the case 1. The slide axle unit 31 includes a pair of sliding axles 311, each of which may be structured as a bolt or screw. The sliding axles 311 extend respectively through the sliding grooves 323 of the two slide groove seats 321, and are respectively fixed to the sliding blocks 223. As a result, each of the sliding blocks 223 is connected to one of the slide groove seats 321 through the corresponding sliding axle 311 and can act on the sliding axle 311 to move along the corresponding sliding groove 323.

Furthermore, in this embodiment, the handle module 200 further includes a pair of second biasing units 4. Each of the second biasing units 4 includes a spring 41 and an engagement piece 42. The engagement piece 42 may be a ball. Each of the sliding blocks 223 is formed with a second receiving cavity 228 at a portion thereof facing the bottom plate portion 324 of the slide groove seat 321 and proximate to where connection to the sliding axle 311 is realized. Each of the springs 41 is retained in the corresponding second receiving cavity 228, and the engaging piece 42 abuts against the other end of the spring 41 and protrudes resiliently from the sliding block 223. Moreover, referring additionally to FIG. 7, corresponding to the mounting of the second biasing units 4, the bottom plate portion 324 of each slide groove seat 321 is formed with a third positioning groove 328 and a fourth positioning groove 329 in a surface opposite that facing the substrate 11, at a location adjacent to the upright plate portion 325, and spaced apart in a direction along which the sliding groove 323 extends at locations approximately corresponding to the first and second ends 326, 327 of the sliding groove 323.

Figure 6:
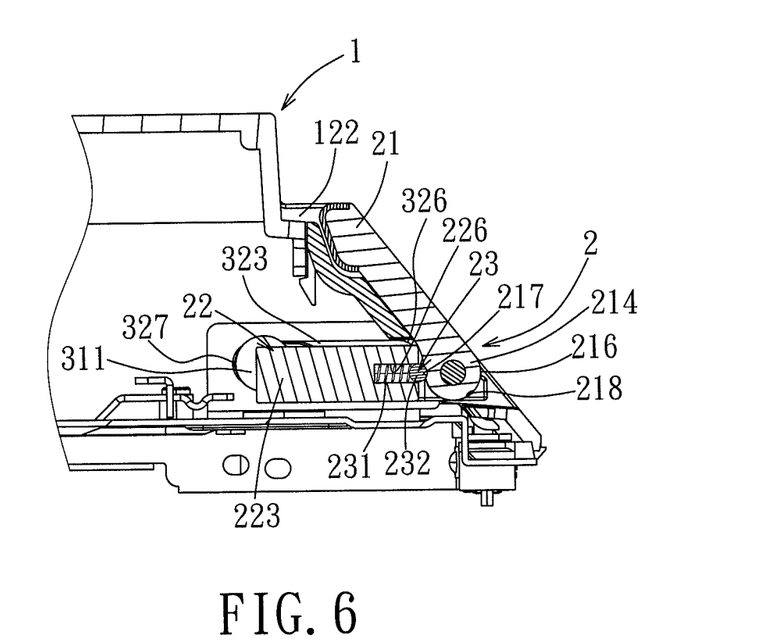
FIG. 6 is a side sectional view of the first embodiment for illustrating the positioning of a first biasing unit when the handle-link assembly is in the folded state.
Figure 7:
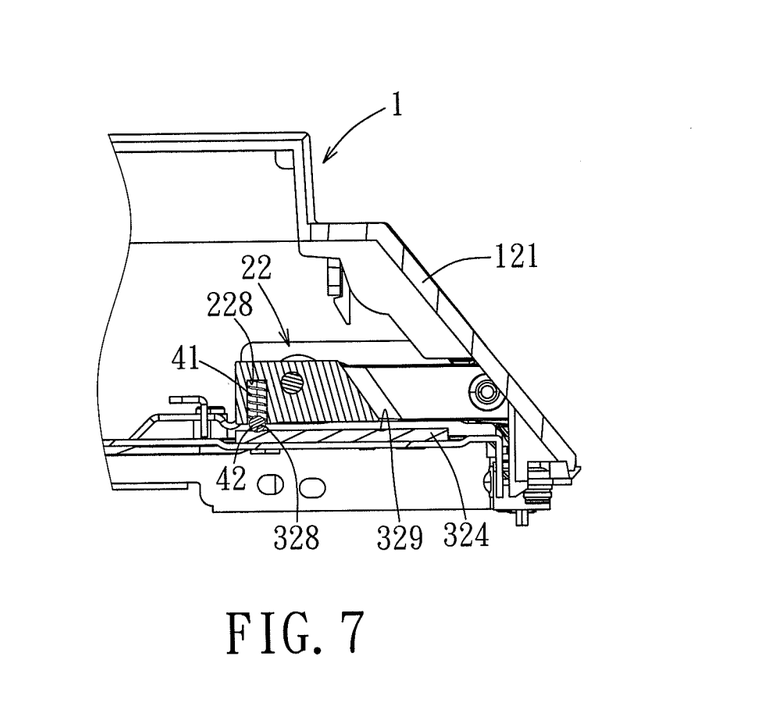
FIG. 7 is a side sectional view of the first embodiment for illustrating the positioning of a second biasing unit when the handle-link assembly is in the unfolded state.

Referring to FIGS. 1, 6, and 7, when the handle-link assembly 2 is disposed in the folded state, the sliding axles 311 connected to the sliding blocks 223 are disposed at the second ends 327 of the sliding grooves 323. At this time, the slide link 22 is positioned in the case 1, and the handle body 21 forms an acute angle with the slide link 22 and is received in the receiving groove 122 of the side wall 121 of the case 1. Furthermore, by engagement between the engagement elements 232 of the first biasing units 23 with the first positioning grooves 217 of the handle body 21, the handle body 21 is limited to forming an acute angle with the slide link 22 and in the state of being received in the side wall 121 of the case 1. At the same time, by engagement of the engagement pieces 42 of the second biasing units 4 in the third positioning grooves 328, the sliding blocks 223 are fixed at a position in which the sliding axles 311 are at the seconds 327 of the sliding grooves 323.

Figure 8:
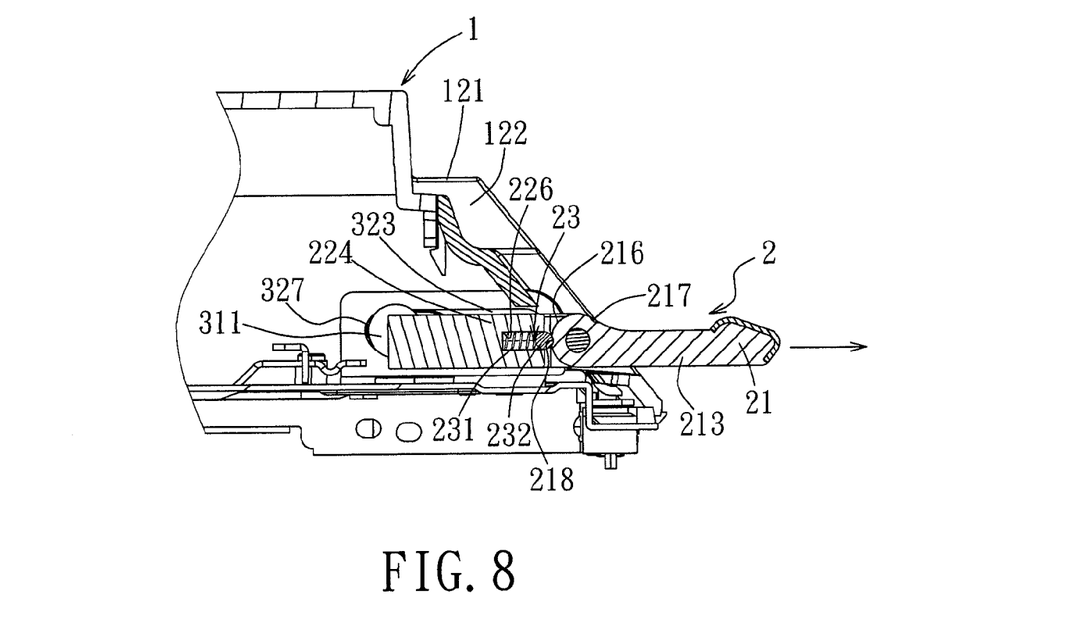
FIG. 8 is a side sectional view of the first embodiment for illustrating the positioning of the first biasing unit during the process when the handle-link assembly is moved from the folded state to the unfolded state.
Figure 9:
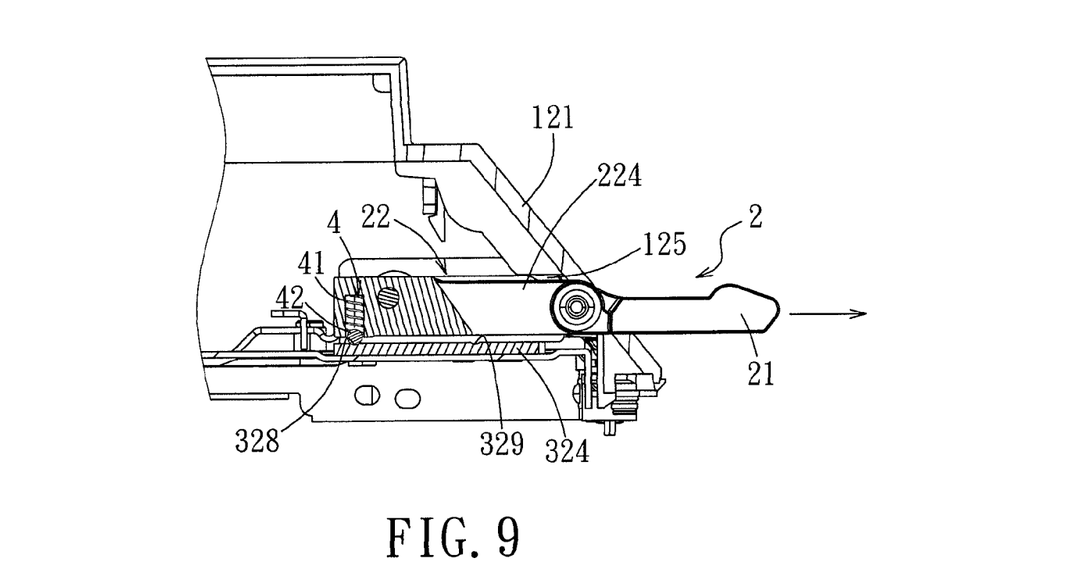
FIG. 9 is a side sectional view of the first embodiment for illustrating the positioning of the second biasing unit during the process when the handle-link assembly is moved from the folded state to the unfolded state.
Figure 10:
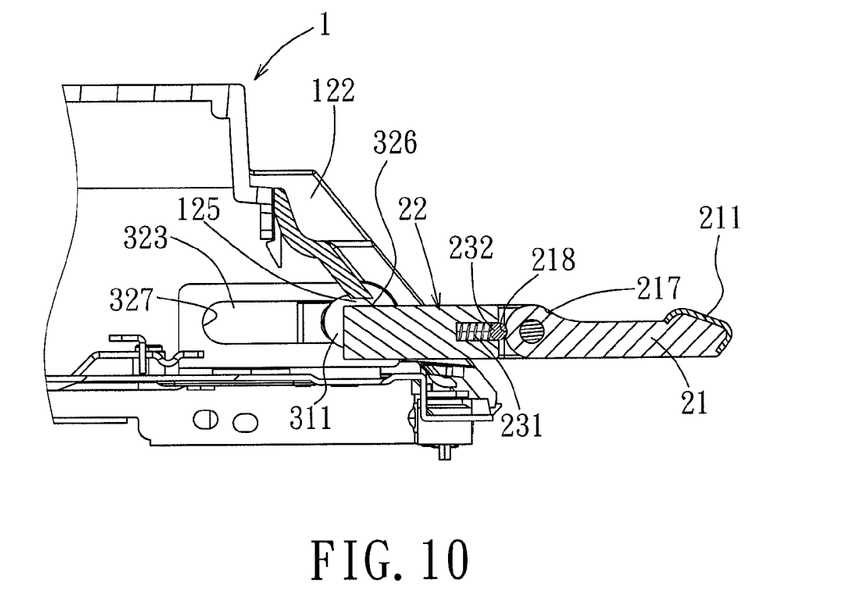
FIG. 10 is a side sectional view of the first embodiment for illustrating the positioning of the first biasing unit when the handle-link assembly disposed in the unfolded state.
Figure 11:
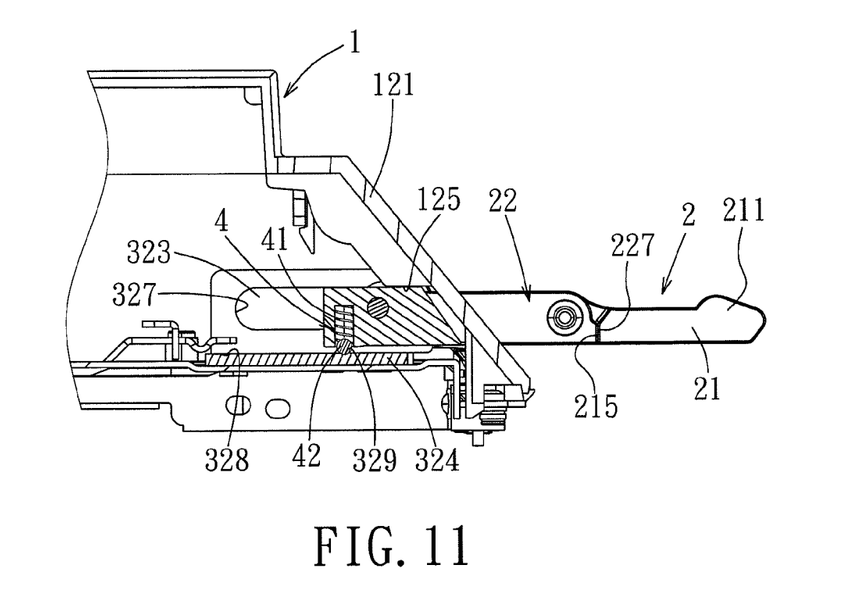
FIG. 11 is a side sectional view of the first embodiment for illustrating the positioning of the second biasing unit when the handle-link assembly is in the unfolded state.

Referring to FIGS. 2, 8, and 9, when the user desires to carry the electronic device 100 using the handle module 200, first, the handle body 21 is pivoted from the position shown in FIG. 6 in a direction away from the side wall 121, so that the handle body 21 is separated from the receiving groove 122 of the side wall 121 until the first extension sections 213 of the handle body 21 and the second extension sections 224 of the slide link 22 form a straight line, and the engaging elements 232 of the first biasing units 23 are disengaged from the first positioning grooves 217 and engaged with the second positioning grooves 218. Next, as shown in FIGS. 10 and 11, the handle body 21 is pulled in a direction away from the side wall 121, so that the slide link 22 is extended from the orifices 125 of the side wall 121 and out of the case 1, and the sliding axles 311 are moved from the second ends 327 to the first ends 326 of the sliding grooves 323. Next, after the engagement pieces 42 of the second biasing units 4 are disengaged from the third positioning grooves 328 of the slide groove seats 321 and are moved to engage the fourth positioning grooves 329 of the slide groove seats 321, the handle-link assembly 2 is positioned in the unfolded state so as to permit the user to grasp the gripping section 211 of the handle body 21 for moving or carrying the electronic device 100. When the gripping section 211 of the handle body 21 is in an extended state, the distance between the gripping section 211 and the side wall 121 of the case 1 is further than that when the handle body 21 is pivoted out of the receiving groove 122 while the slide link 22 is still in the position of the folded state, as shown in FIG. 9. In other words, there is sufficient spacing between the gripping section 211 of the handle body 21 and the side wall 121 of the case 1 to allow the hand of the user to extend thereinto to hold the gripping section 211 of the handle body 21.

On the other hand, when the user is not using the handle module 200, the handle-link assembly 2 is moved toward the side wall 121 of the case 1 so that the slide link 22 is received in the case 1, and the engaging pieces 42 of the second biasing units 4 re-engage the third positioning grooves 328. Next, the handle body 21 is pivoted toward the side wall 121 to be received in the receiving groove 122 of the side wall 121, and the engaging elements 232 of the first biasing units 23 re-engage the first positioning grooves 217 so that the handle-link assembly 2 is again disposed in the folded state.

It is to be noted that in this embodiment and with reference to FIGS. 4 and 11, by the formation of the first abutting surfaces 215 at the end of the first extension sections 213 and the second abutting surfaces 227 at the second extension sections 224, when the handle body 21 is pivoted from the folded state out of the engaging groove 122 until forming a straight line with the slide link 22, the first abutting surfaces 215 of the first extension sections 213 abut against the second abutting surfaces 227 of the second extension sections 224 so as to prevent the handle body 21 from freely pivoting relative to the slide link 22. As a result, when the user grasps the handle body 21 to carry the electronic device 100, the case 1 is prevented from swinging back and forth relative to the handle module 200 and thereby providing discomfort to the user. Moreover, this formation also prevents the handle body 21 from pivoting excessively relative to the slide link 22 when the handle body 21 is moved from the folded state to the unfolded state.

The provision of the first biasing units 23 and the second biasing units 4 not only limits the positions of the handle body 21 and the slide link 22 in the folded and unfolded states, but also, when the user moves the handle-link assembly 2 between the folded state and the unfolded state, the user is able to determine that movement into the states is completed through the clicking feeling provided by engagement of the engaging elements 232 and the engaging pieces 42 with the first, second, third, and fourth positioning grooves 217, 218, 328, 329.

From the aforementioned, in the first embodiment, by the provision of the handle module 200, not only is it convenient for the user to carry the electronic device 100, but through structural cooperation between the handle module 200 and the case 1, when the handle-link assembly 2 is disposed in the folded state, the slide link 22 is received in the case 1, and only the handle body 21 is partially exposed in the state where it is received in the side wall 121 of the case 1. Therefore, when the handle module 200 is not in use, the overall appearance of the case 1 is not affected. Moreover, when the user desires to use the handle module 200, after the slide link 22 is pulled out of the case 1, the space between the handle body 21 and the side wall 121 of the case 1 can be increased to allow the hand of the user to conveniently hold the handle body 21.

Figure 12:
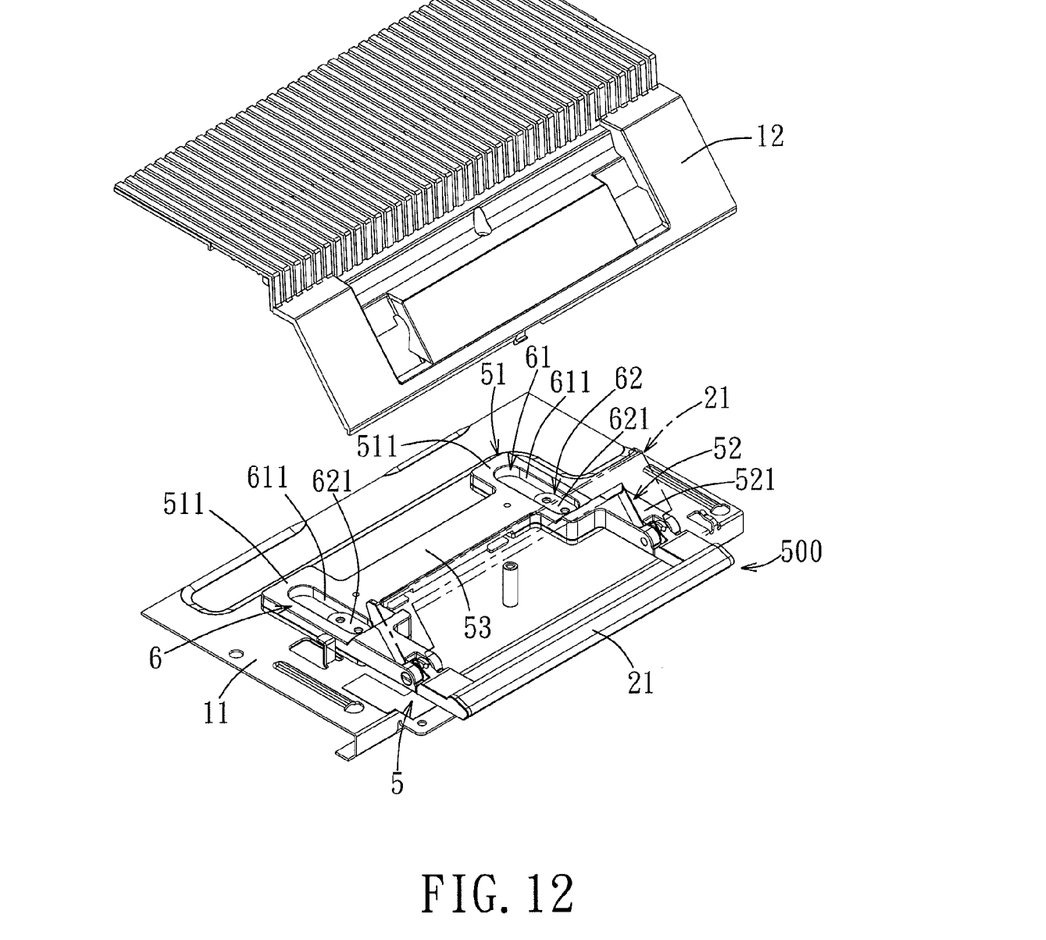
FIG. 12 is a perspective view of the second embodiment of an electronic device having a handle module according to the present invention, illustrating a handle-link assembly thereof in a folded state and an unfolded state, the folded state being illustrated by dotted lines.
Figure 13:
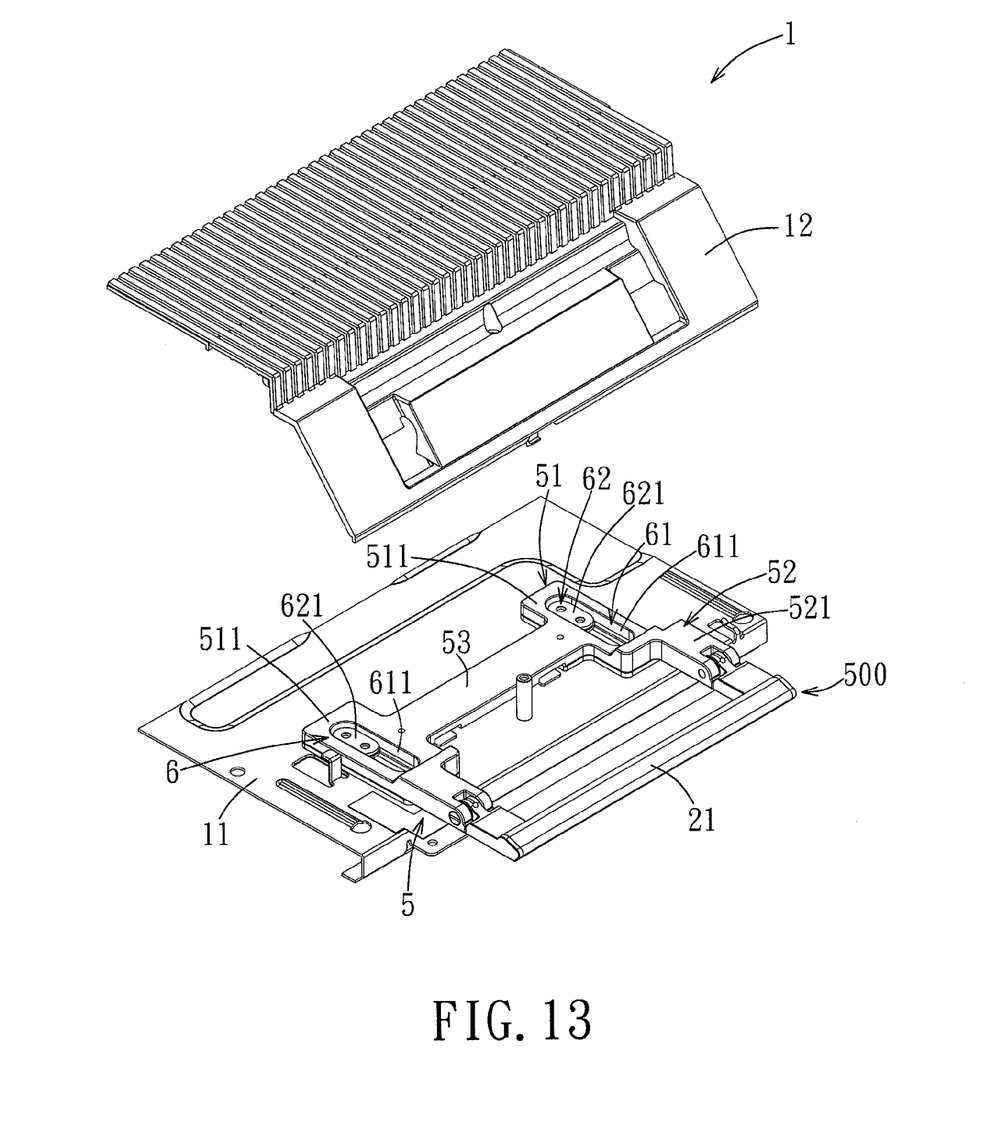
FIG. 13 is a perspective view of the second embodiment, illustrating the handle-link assembly in the unfolded state.

Referring to FIGS. 12 and 13, the differences of the second embodiment of a handle module 500 according to this invention from the first embodiment reside in the handle-link assembly 5 and the slide mechanism 6. In the second embodiment, the handle-link assembly 5 includes a link body unit 51, a second pivot connection portion 52, and a connection section 53. The link body unit 51 similarly includes a pair of sliding blocks 511. The connection section 53 interconnects the sliding blocks 511 so that the sliding blocks 511 form a single-body structure. The structure of the second pivot connection portion 52 is the same as in the first embodiment, and hence is not further detailed.

The slide mechanism 6 includes a slide groove unit 61 and a slide axle unit 62. In the second embodiment, the slide groove unit 61 includes a pair of sliding grooves 611 formed respectively in the sliding blocks 511. The vertical cross section of each sliding groove 611 is generally T-shaped. The slide axle unit 62 similarly includes a pair of sliding axles 621, each of which also has a generally T-shaped vertical cross section. The sliding axles 621 extend into the sliding grooves 611 of the sliding blocks 511 and are fixed to the substrate 11 (such as through the use of fasteners), so that the handle-link assembly 5 is mounted on the substrate 11 through the sliding axles 621. Since the vertical cross sections of both the sliding axles 621 and the sliding grooves 611 are T-shaped, the sliding axles 621 not only prevent removal of the handle-link assembly 5 from the substrate 11, but when the handle-link assembly 5 is driven by the handle body 21, the handle-link assembly 5 moves relative to the sliding axles 621. Since the positioning of the handle body 21 relative to the case 1 when in the folded and unfolded states is generally the same as in the first embodiment, an explanation in this regard is not provided herein.

From the aforementioned, by the provision of the handle module 200, 500 of this invention, not only is it convenient for the user to move or carry the electronic device 100, but also, since there is a large space between the gripping section 211 and the case 1 when the gripping section 211 of the handle body 21 is pulled outward to the unfolded state, the hand of the user can be conveniently extended therein to hold the gripping section 211. Moreover, when the handle module 200, 500 is not in use, part of the handle module 200, 500 (the slide link 22) is received in the case 1, and another part (the handle body 21) is received in the surface of the case 1, so that a favorable outer appearance of the electronic device 100 is maintained.

While the present invention has been described in connection with what are considered the most practical and embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A handle module for mounting in a case of an electronic device, said handle module comprising:
    a handle-link assembly including
        a handle body having a gripping section exposed from the case, and a first pivot connection portion formed on said gripping section, and
        a slide link having a link body unit, and a second pivot connection portion formed on said link body unit, said second pivot connection portion of said slide link being pivotable with said first pivot connection portion of said handle body; and
    a slide mechanism including a slide groove unit disposed in one of said link body unit and the case of the electronic device, and a slide axle unit fixed to the other one of said link body unit and the case of the electronic device, and that is slidably extended into said slide groove unit;
    said handle-link assembly being operable to be moved between a folded state, where said slide link is received in the case, and an unfolded state, where said slide groove unit and said slide axle unit are moved relative to each other until said slide link is extended out of the case and said handle body is distanced more from the case than when in the folded state;
    wherein the case includes a side wall, a receiving groove formed on an outer surface of the side wall, and an opening portion extending through the side wall, when in the folded state, said handle body engages the receiving groove of the side wall, and when in the unfolded state, said handle body is disengaged from the receiving groove of the side wall and said slide link is extended out of the case from the opening portion; and
    wherein said first pivot connection portion of said handle body is formed with a first positioning groove, said handle-link assembly further including a first biasing unit that is disposed in said second pivot connection portion of said slide link and that has an engaging element engaging resiliently said first positioning groove to limit said handle body in the folded state or in the unfolded state.

2. The handle module of claim 1, wherein said first pivot connection portion of said handle body is further formed with engaging element engaging resiliently said first positioning groove or said second positioning groove, when in the folded state, said engaging element engaging said first positioning groove to limit said handle body in the folded state, and when in the unfolded state, said engaging element engaging said second positioning groove to limit said handle body in the unfolded state.

3. The handle module of claim 2, wherein said first pivot connection portion includes a pair of first extension sections extending in the same direction in a spaced apart manner from said gripping section, and said second pivot connection portion includes a pair of second extension sections extending in the same direction in a spaced apart manner from said link body unit, said handle body and said slide link being pivotable relative to each other through said first extension sections and said second extension sections.

4. The handle module of claim 3, wherein said first biasing unit further includes a spring disposed in one of said second extension sections, and said engaging element is a ball that abuts against said spring.

5. The handle module of claim 3, wherein said first pivot connection portion further includes a pair of first protruding pieces extending respectively from ends of said first extension sections and each having an outer circumferential surface that is formed with said first positioning groove and said second positioning groove, said second pivot connection portion further including two pairs of spaced apart second protruding pieces, each pair extending in a spaced apart manner from an end of one of said second extension sections, each of said first protruding pieces being connected pivotably between a corresponding pair of said second protruding pieces, a receiving cavity for retaining a corresponding one of said first biasing units being formed extending inwardly on an end portion of each of said second extension sections at a location between corresponding ones of said second protruding pieces, said engaging element of said first biasing unit protruding resiliently from said receiving cavity.

6. The handle module of claim 5, wherein first abutting surfaces are formed respectively at two locations on an end of each of said first extension sections, a second abutting surface being formed on each of said second protruding pieces facing a corresponding one of said first abutting surfaces, when said handle-link assembly is moved from the folded state to the unfolded state, said handle body is operated to rotate said slide link to be disengaged from the engaging groove, and said handle body is moved to a position aligned with said slide link, each of said first abutting surfaces abutting against a corresponding one of said second abutting surfaces.

7. The handle module of claim 3, wherein said slide groove unit includes a pair of slide groove seats, each of said slide groove seats having a seat body fixed to the case and formed with a sliding groove in said seat body, and said slide axle unit includes a pair of sliding axles, each of which is mounted slidably in a respective one of said sliding grooves to connect with said link body unit.

8. The handle module of claim 7, wherein each of said slide groove seats includes a bottom plate portion fixed to the case, and an upright plate portion extending upwardly from said bottom plate portion, a respective one of said sliding grooves being formed in said upright plate portion.

9. The handle module of claim 7, wherein said link body unit includes a pair of sliding blocks, said second extension sections being extended respectively from said sliding blocks, said sliding axles being connected respectively to said sliding blocks.

10. The handle module of claim 8, wherein each of said bottom plate portions is formed with a third positioning groove and a fourth positioning groove that are spaced apart from each other along a direction of extension of said sliding groove, said handle module further including a second biasing unit disposed in said link body unit of said slide link and having an engaging piece engaging resiliently one of said third positioning groove and said fourth positioning groove, when in the folded state, said engaging piece of said second biasing unit engaging said third positioning groove to limit said slide link to be disposed in the folded state, and when in the unfolded state, said engaging piece of said second biasing unit engaging said fourth positioning groove to limit said slide link to be disposed in the unfolded state.

11. The handle module of claim 3, wherein said link body unit includes a pair of sliding blocks, and said slide link further includes an elongated connection section connecting said sliding blocks, said slide groove unit including a pair of sliding grooves formed respectively in said sliding blocks, said slide axle unit including a pair of sliding axles extending respectively into said sliding grooves and that are fixed to the case.

12. An electronic device having a handle module comprising:
a case including a side wall, and formed with an opening portion extending through said side wall;
an electronic component module mounted in said case; and
a handle module including
a handle-link assembly including
a handle body having a gripping section exposed from said case, and a first pivot connection portion formed on said gripping section, and
a slide link having a link body unit, and a second pivot connection portion formed on said link body unit, said second pivot connection portion of said slide link being pivotable with said first pivot connection portion of said handle body, and
a slide mechanism including a slide groove unit disposed in one of said link body unit and said case, and a slide axle unit fixed to the other one of said link body unit and said case, and that is slidably extended into said slide groove unit;
said handle-link assembly being operable to be moved between a folded state, where said slide link is received in said case, and an unfolded state, where said slide groove unit and said slide axle unit are moved relative to each other, and said slide link is extended out of said case through said opening portion and said handle body is distanced more from said side wall of said case than when in the folded state;
wherein said case is formed with a receiving groove on an outer surface of said side wall, when in the folded state, said handle body engaging said receiving groove of said side wall, and when in the unfolded state, said handle body being disengaged from said receiving groove; and
wherein said first pivot connection portion of said handle body is formed with a first positioning groove, said handle-link assembly further including a first biasing unit that is disposed in said second pivot connection portion of said slide link and that has an engaging element engaging resiliently said first positioning groove to limit said handle body to be disposed in the folded state or in the unfolded state.

13. The electronic device having a handle module of claim 12, wherein said first pivot connection portion of said handle body is further formed with at least one second positioning groove, said engaging element engaging resiliently said first positioning groove or said second positioning groove, when in the folded state, said engaging element engaging said first positioning groove to limit said handle body to be disposed in the folded state, and when in the unfolded state, said engaging element engaging said second positioning groove to limit said handle body to be disposed in the unfolded state.

14. The electronic device having a handle module of claim 13, wherein said first pivot connection portion includes a pair of first extension sections extending in the same direction in a spaced apart manner from said gripping section, and said second pivot connection portion includes a pair of second extension sections extending in the same direction in a spaced apart manner from said link body unit, said handle body and said slide link being pivotable relative to each other through said first extension sections and said second extension sections.

15. The electronic device having a handle module of claim 14, wherein said first biasing unit further includes a spring disposed in one of said second extension sections, and said engaging element is a ball that abuts against said spring.

16. The electronic device having a handle module of claim 14, wherein said first pivot connection portion further includes a pair of first protruding pieces extending respectively from ends of said first extension sections and each having an outer circumferential surface that is formed with said first positioning groove and said second positioning groove, said second pivot connection portion further including two pairs of spaced apart second protruding pieces, each pair extending in a spaced apart manner from an end of one of said second extension sections, each of said first protruding pieces being connected pivotably between a corresponding pair of said second protruding pieces, a receiving cavity for retaining a corresponding one of said first biasing units being formed extending inwardly on an end portion of each of said second extension sections at a location between corresponding ones of said second protruding pieces, said engaging element of said first biasing unit protruding resiliently from said receiving cavity.

17. The electronic device having a handle module of claim 16, wherein first abutting surfaces are formed respectively at two locations on an end of each of said first extension sections, a second abutting surface being formed on each of said second protruding pieces facing a corresponding one of said first abutting surfaces, when said handle-link assembly is moved from the folded state to the unfolded state, said handle body is operated to rotate said slide link to be disengaged from the engaging groove, and said handle body is moved to a position aligned with said slide link, each of said first abutting surfaces abutting against a corresponding one of said second abutting surfaces.

18. The electronic device having a handle module of claim 14, wherein said slide groove unit includes a pair of slide groove seats, each of said slide groove seats having a seat body fixed to the case and that is formed with a sliding groove, and said slide axle unit includes a pair of sliding axles, each of which is mounted slidably in a respective one of said sliding grooves to connect with said link body unit.

19. The electronic device having a handle module of claim 18, wherein each of said slide groove seats includes a bottom plate portion fixed to said case, and an upright plate portion extending upwardly from said bottom plate portion, a respective one of said sliding grooves being formed in said upright plate portions.

20. The electronic device having a handle module of claim 18, wherein said link body unit includes a pair of sliding blocks, said second extension sections being extended respectively from said sliding blocks, said sliding axles being connected respectively to said sliding blocks.

21. The electronic device having a handle module of claim 19, wherein each of said bottom plate portions is formed with a third positioning groove and a fourth positioning groove that are spaced apart from each other along a direction of extension of said sliding groove, said handle module further including a second biasing unit disposed in said link body unit of said slide link and having an engaging piece engaging resiliently one of said third positioning groove and said fourth positioning groove, when in the folded state, said engaging piece of said second biasing unit engaging said third positioning groove to limit said slide link to be disposed in the folded state, and when in the unfolded state, said engaging piece of said second biasing unit engaging said fourth positioning groove to limit said slide link to be disposed in the unfolded state.

22. The electronic device having a handle module of claim 14, wherein said link body unit includes a pair of sliding blocks, and said slide link further includes an elongated connection section connecting said sliding blocks, said slide groove unit including a pair of sliding grooves formed respectively in said sliding blocks, said slide axle unit including a pair of sliding axles extending respectively into said sliding grooves and that are fixed to said case.

\* \* \* \* \*